United States Patent [19]

Frank et al.

[11] Patent Number: 5,646,520

[45] Date of Patent: Jul. 8, 1997

[54] METHODS AND APPARATUS FOR SENSING CURRENTS

[75] Inventors: Richard Frank, Mountain View; Bruce Lee Inn, Santa Clara; Tamas Szepesi, San Jose, all of Calif.

[73] Assignee: National Semiconductor Corporation, Santa Clara, Calif.

[21] Appl. No.: 267,818

[22] Filed: Jun. 28, 1994

[51] Int. Cl.$^6$ .......................... G01R 19/00; G11C 27/02
[52] U.S. Cl. .................. 324/158.1; 324/118; 327/93
[58] Field of Search ................... 324/158.1, 122, 324/133, 118; 73/861.17; 330/9, 10

[56] References Cited

U.S. PATENT DOCUMENTS

| Re. 30,297 | 6/1980 | Wittlinger | 330/288 |
|---|---|---|---|
| 2,866,019 | 12/1958 | Pedersen | 330/10 |
| 3,329,018 | 7/1967 | Hognestad | 73/861.17 |
| 3,430,125 | 2/1969 | Povenmire et al. | 324/118 |
| 3,597,696 | 8/1971 | Rabindran | 330/9 |
| 3,735,274 | 5/1973 | Nelson | 330/9 |
| 3,759,097 | 9/1973 | Cushing | 73/861.17 |
| 4,004,220 | 1/1977 | Kerber et al. | 324/122 |
| 4,227,408 | 10/1980 | Schmoock et al. | 73/861.17 |
| 4,430,622 | 2/1984 | Simoes | 330/9 |
| 4,477,737 | 10/1984 | Ulmer et al. | 307/297 |
| 4,494,181 | 1/1985 | Ramlohr et al. | 363/63 |
| 4,528,496 | 7/1985 | Naokawa et al. | 323/315 |
| 4,533,845 | 8/1985 | Bynum et al. | 307/540 |
| 4,562,386 | 12/1985 | Goff et al. | 318/254 |
| 4,575,662 | 3/1986 | Lehnhoff | 318/282 |
| 4,616,305 | 10/1986 | Damiano et al. | 363/132 |
| 4,641,246 | 2/1987 | Halbert et al. | 324/118 |
| 4,654,568 | 3/1987 | Mansmann | 318/293 |
| 4,667,121 | 5/1987 | Fay et al. | 307/580 |
| 4,677,323 | 6/1987 | Marsh | 307/571 |
| 4,705,997 | 11/1987 | Juzswik | 318/341 |
| 4,710,685 | 12/1987 | Lehnhoff et al. | 318/287 |

(List continued on next page.)

OTHER PUBLICATIONS

Dr. Nathan Zommer et al., "Power Current Mirror Devices and Their Applications", 14 PCIM, Sep. 1986.

"Automotive Hi-Side Gate Driver", IXYS Corp, Nov. 25, 1987.

Motorola Semiconductor Technical Data, "SMARTpower High Side Logic-to-Power Switch", Motorola Inc.

PESC '88 Record, 19th Annual IEEE Power Electronics Specialists Conference, Doshisha University, Kyoto, Japan, Apr. 11–14, 1988, vol. 2.

(List continued on next page.)

Primary Examiner—Ernest F. Karlsen
Attorney, Agent, or Firm—Limbach & Limbach L.L.P.

[57] ABSTRACT

An apparatus for sensing current in a switching device having resistive voltage-current characteristics includes a first and second power terminal (typically common or ground) for the application therebetween of an operating potential (or alternatively, power), an impedance connected between the first power terminal and a node, a switching device having its main conduction path connected between the node and the second power terminal for controlling the flow of current through the impedance, at least one sense device coupled to the node, operative to sense or divide the potential at the node to thereby provide a sensing potential, where at least one of the sense devices is switched only during at least a portion of the period when the switching device is turned on, and a voltage reference generating circuit operative to generate a reference voltage for comparison with the sensed potential. A method for sensing current in a switching device having resistive voltage-current characteristics, samples the potential at a node connecting the switching device to the impedance only during at least a portion of the period when the switching device is turned on, to generate a sensed potential, generates a reference potential for comparison with the sensed potential.

3 Claims, 7 Drawing Sheets

U.S. PATENT DOCUMENTS

| | | | |
|---|---|---|---|
| 4,710,686 | 12/1987 | Guzik | 318/293 |
| 4,719,396 | 1/1988 | Shimiza | 318/432 |
| 4,769,619 | 9/1988 | Taylor | 330/288 |
| 4,820,968 | 4/1989 | Wrathall | 323/316 |
| 4,866,312 | 9/1989 | Kearney et al. | 307/496 |
| 4,885,477 | 12/1989 | Bird et al. | 307/296.8 |
| 5,013,934 | 5/1991 | Hobrecht et al. | 307/296.7 |
| 5,021,682 | 6/1991 | Hobrecht | 307/296.8 |
| 5,032,745 | 7/1991 | Izadinia et al. | 307/571 |
| 5,032,774 | 7/1991 | Juzswik | 318/293 |
| 5,081,379 | 1/1992 | Korteling | 307/530 |
| 5,210,475 | 5/1993 | Juzswik et al. | 318/293 |
| 5,245,523 | 9/1993 | Juzswik | 363/56 |

OTHER PUBLICATIONS

Donald L. Zaremba, Jr., "How Current Sense Technology Improves Power Mosfet Switching Applications", 1986 Conference Record, Los Angeles, CA.

Artusi et al., "New Smartpower Devices Ease the Interfacing to Power Loads", 1987 Conference Record, Los Angeles, CA.

Arthur B. Glaser et al., "Integrated Circuit Engineering-Design, Fabrication, and Applications", Bell Telephone Laboratories, Inc., 1977.

Alan B. Grebene, "Bipolar And MOS Analog Integrated Circuit Design", John Wiley & sons, 1984.

Joseph Di Giacomo, "VLSI Handbook", McGraw-Hill, 1989.

Gordon J. Deboo et al., "Integrated Circuits and Semiconductor Devices: Theory and Application", McGraw-Hill, 1977.

DeWitt G. Ong, "Modern MOS Technology: Processes, Devices, and Design", McGraw-Hill, 1984.

Jacob Millman, PH.D., et al., "Microelectronics", McGraw-Hill, 1987.

Robert Boylestad et al., "Electronic Devices and Circuit Theory", Prentice-Hall, Third Edition, 1982.

Hans R. Camenzind, "Electronic Integrated Systems Design", Litton Educational Publishing, Inc., 1972.

Charles A. Holt, "Electronic Circuits Digital and Analog", John Wiley & Sons, 1978.

Paul M. Chirlian, "Analysis and Design of Integrated Electronic Circuits", Harper & Row, 1981.

Paul Horowitz et al., "The Art of Electronics", Cambridge University Press, Second Edition, 1989.

Adel S. Sedra et al., "Microelectronic Circuits", CBS College Publishing, 1982.

A. Dubhashi et al., "Introducing the IR8200 DMOS H-Bridge Power IC", International Rectifier.

Frank Goodenough, "Mosfet Measures Current With No Loss", Electronic Design, Feb. 20, 1986, pp. 59-60.

Mansour Izadinia et al., "A High Performance Monolithic DMOS Bridge For Motor Drive".

Mansour Izadinia et al., "A Next Generation High Performance CMOS/Bipolar/DMOS H-Switch".

National Semiconductor Corporation, "LMD18200 3A, 55V H-Bridge", Power IC's Databook, 1993, §4, pp. 61-67.

Partial Schematic Diagram of National Semiconductor LMD18200 3A, 55V H-Bridge.

METHODS AND APPARATUS FOR SENSING CURRENTS

BACKGROUND OF THE INVENTION

1. Field of the Invention

The present invention relates generally to the sensing of currents and in particular to methods and apparatus for sensing current flowing through devices which exhibit resistive voltage-current characteristics when such devices function as switches.

2. Description of the Related Art

Control of functions within a circuit frequently depend upon the accurate sensing of the amount of current flowing through at least a portion of the circuit. For example, one such circuit is a switching mode power supply. Current-mode control of switching mode power supplies is a popular technique because such control provides speed and stability advantages. In order to provide current-mode control, however, it is necessary to sense the instantaneous current in the switching device of the switching mode power supply. Such sensing can be grouped into three categories, namely, resistive sensing, magnetic sensing and source-sensing.

With reference to FIG. 1, a simplified resistive sensing circuit 100 within a power supply circuit is illustrated. The sensing circuit 100 includes a sense resistor 102, a power switch 104 connected between sense resistor 102 and an impedance 106, an unregulated power input 108 connected to impedance 106, and a voltage sense output 114 which is coupled to a comparator (not shown). Impedance 106 could, for example, be a transformer, inductor or motor drive circuit. The comparator compares the potential of voltage sense output 114 to a known quantity and in response generates a signal to thereby regulate the amount of power provided to impedance 106. As will be appreciated by those skilled in the art, such a signal regulates, for example, the duty cycle (i.e., the percentage of on-time) and/or the frequency of the switching action of power switch 104. Other variables (such as the potential of the unregulated power and the value of impedance 106) being constant, an increase in the duty cycle increases the amount of power provided to impedance 106.

In further detail, sense resistor 102 is generally a low inductance and highly-linear resistor which is connected in series with impedance 106. Sense resistor 102 generates a voltage drop proportional to the current through power switch 104 where, according to Ohm's law, the potential of the voltage drop is equal to the product of the current through sense resistor 102 and the resistance of sense resistor 102. This simple arrangement is very attractive theoretically, but in actual use, the arrangement is plagued with disadvantages.

First, since the sense resistor 102 conducts the entire amount of current through power switch 104, the resistive sensing arrangement inherently results in a large power dissipation, or stated differently, the sense resistor 102 generates a large amount of heat from power which otherwise would be available to impedance 106. Although such power dissipation can be decreased by decreasing the resistance of sense resistor 102, such a change also attenuates the amplitude of the sense signal provided to voltage sense output 114. Because of the nature of the waveform generated by power switch 104 (basically a square wave, with residual spectral components due to reactive elements within switch 102 and impedance 108) the sense signal is also noisy, and thus an attenuation of its amplitude makes it more difficult for the comparator to operate properly. Thus, resistive sensing inherently requires a trade-off of sense signal amplitude against power dissipation. In addition, resistive sensing requires a precise, accurate, non-inductive resistor since the current through the sense resistor is calculated by dividing the sense voltage by the sense resistance. Furthermore, to the extent a non-inductive resistor has residual inductance, the sense voltage would also vary as a function of the spectral content the switched current. Although precision non-inductive resistors are commercially available, they are more expensive than ordinary wirewound resistors. Furthermore, the value of precision non-inductive resistors varies over temperature and time, thereby making the accuracy of current sensing by resistive sensing a function of temperature and age of the sense resistor.

Another method of sensing switching current is known as magnetic current sensing. With reference now to FIG. 2, a simplified magnetic current sensing circuit 200 is shown. The magnetic current sensing circuit 200 utilizes a current transformer 202 having a primary 204 connected in series with an impedance 206 and a power switch 208. One end of a secondary 210 of transformer 202 is, together with one end of power switch 208, connected to ground (also referred to herein as "common") while the other end of secondary 210 is provided to a voltage sense output 212. Both the primary 204 and the secondary 210 are wound about a core 214. Core 214 typically consists of a closed magnetic circuit formed of ferrite or laminated magnetic steel. Impedance 206 is also coupled to an unregulated power input 216, while voltage sense output 212 is coupled to a comparator (not shown). Such a comparator compares the potential of the voltage sense output 212 to a known quantity and in response generates a signal to thereby regulate the duty cycle of the current provided to impedance 206. A resistor 218 is coupled from the voltage sense output 212 to ground, and operates to insure that the primary 204 presents a low impedance. The resistor 218 also operates to convert current flowing through secondary 210 into a voltage. As with the resistive sensing arrangement previously described, such a signal regulates, for example, the duty cycle and/or frequency of power switch 208.

In operation, the secondary 210 develops a sense voltage which is proportional to the current flowing through primary 204. The magnetic sensing method is more accurate than the resistive sensing method because of a relative lack of thermal rise and because the conversion ratio for the sense signal can be expressed as a real number as opposed to a complex function, as in the case of a resistor which has nonlinearities. In addition, since transformer 202 can be of a step-up type (i.e., a greater number of windings in the secondary 210 than in the primary 204), the sense signal can be amplified. Thus, by utilizing a primary 204 with a low impedance (both resistive and reactive) a relatively large signal can be provided to sense voltage output 212 while the voltage drop across primary 204 is minimized.

Magnetic sensing, however, suffers disadvantages. A suitable transformer adds significant cost to a design. In addition, such transformers are difficult to emplace during automated assembly.

Recently, because manufacturers of DMOS (diffused metal-oxide semiconductor) power transistors offer packages containing a power switching device and a matched, smaller companion sense device, switching mode power supplies using current-mode control commonly rely upon "source sensing". Source sensing (also known as "sense FET" sensing) is a method which is based upon the fact that devices which are integrated into a common environment (such as a single chip of silicon) exhibit nearly identical electrical characteristics.

With reference now to FIG. 3, a simplified source sensing circuit 300 is shown. Source sensing circuit 300 includes a switching device 302 connected in series between an impedance 304 and ground. A sense device 306 has its drain connected to the drain of switching device 302. Sense device 306 also has its gate connected to the gate of switching device 302. The source of sense device 306 provides a sense current to a sense lead 308 which is coupled to a comparator (not shown). An unregulated power input 310 provides power to impedance 304.

In further detail, switching device 302 and sense device 306 are fabricated on a single chip to form a high current DMOS power transistor and a matching low-current sense device, respectively. Because devices 302 and 306 are fabricated as arrays of a fundamental cell, the ratio of drain-source currents through each device at any given gate-source voltage is equal to the ratio of the number of cells contained in the array for each device.

In a switching mode power supply which utilizes such DMOS devices, switching device 302 conducts the switch current, while sense device 306 conducts a fraction of the switch current in response to a gate drive voltage, $V_g$, at a gate drive input 312. Since the gates of the sense device and the switching device are connected in common to the same potential (the gate drive voltage which is generated in part by the comparator), if the potential of the source of each device is also equal, then the ratio of the sense device current to the switching device current is known (based upon the respective physical dimensions of each device), and the current in the sense device can be taken as representative of (a known fraction of) the switch current. For this arrangement to be useful, however, it is desireable that the source potential of the sense device tracks with the source potential of the switching device. Such tracking can be implemented by one of two methods. Each of these methods can be distinguished by the connection made to the source of the sense device. One method can be described as "resistive multiplication" while the second method can be described as "virtual earth sensing".

Referring now to FIG. 4, shown is a simplified diagram for source sensing circuit 400 which employs resistive multiplication 400. In circuit 400 a switching device 402 has its gate connected in common with the gate of a sense device 404. The drain of switching device 402 is connected in common to the drain of sense device 404 and to an impedance 406. The impedance 406 is coupled to an unregulated power input 408. The source of switching device 402 is connected to ground while the source of sense device 404 is connected in common to one end of a sense resistor 410 and a first input 412 of a single supply amplifier 414. A second input 416 of operational amplifier 412 is connected in common with a second end of resistor 410 to ground. A voltage sense output 418 of amplifier 414 provides a sense voltage which is used by control circuitry (not shown) to drive a gate drive input 420 of devices 402 and 404.

In operation, since the source of switching device 402 is hard-grounded (i.e., connected directly to ground) and the source of sense device 404 is coupled to ground through sense resistor 410, sense resistor 410 generates a voltage (whose potential is directly proportional to the current through sense resistor 410) which can be detected amidst noise generated the circuit 400 and its associated circuitry, but which potential is not so large as to destroy the approximate parity between the gate-source voltages of sense device 404 and switching device 402. Thus, the source voltage of sense device 404 reflects a fraction of the switch current of switching device 402, multiplied by the value of resistor 410, hence the name "resistive multiplication". The voltage developed across sense resistor 410 is then amplified by amplifier 414 and is utilized by control circuitry to drive the gate of switching device 402 to thereby switch the current flowing through impedance 304.

Theoretically, the resistive multiplication of source sensing has the advantages of low power dissipation (because of the low amount of current flowing through sense resistor 410, in contrast to that of sense resistor 102 of FIG. 1) and of simplicity since the additional components over the circuit 300 are sense resistor 410 and single-supply amplifier 414. However, in practical application, such a circuit 400 does not perform sufficiently well for many applications. Basically, the theoretical simplicity afforded by circuit 400 cannot be realized with a two-component, single-ended sense circuit. The first reason is that with an actual circuit the level of noise generated by such a circuit interferes with the sense voltage. The second reason is that since current mode control must operate at high speed, a single-supply operational amplifier may not have a sufficient bandwidth to sufficiently amplify the sense voltage to permit control of the switching device. For if a control loop is to operate in the tens of kilohertz range, the bandwidth of the remaining circuitry must be in the megahertz range.

With reference now to FIG. 5, a virtual earth sensing circuit 500 is now described. Circuit 500 includes a switching device 502 and a sense device 504. A gate drive input 506 is connected in common to the gates of devices 502 and 504, while an impedance 508 is connected in common to the drains of devices 502 and 504. Impedance 508 is coupled to an unregulated power input 510. A non-inverting input 512 of an operational amplifier 514 is connected to a special voltage sensing pad 516. The source of switching device 502 is connected to ground. The source of sense device 504 is connected to an inverting input 518 of operational amplifier 514. A feedback resistor 520 couples an output 522 of operational amplifier 514 to inverting input 516.

In operation, the virtual earth source sensing circuit 500 provides greater accuracy and speed than the circuit 400 since the potential of the source of sense device 504 more closely tracks that of the source of switching device 502. This closer tracking is achieved by configuring operational amplifier 514 in a transresistance circuit. In further detail, the source of sense device 504 is connected to a summing node (inverting input 518) and a reference node (non-inverting input 512) is connected to the sensing pad 516. Feedback provided through resistor 520 maintains equality between the voltages at the summing and reference nodes. Operational amplifier 514 converts the current flowing through sense device 504 to a voltage at output 522. Thus, the virtual earth sensing circuit 500 provides faster and more accurate response than the resistive multiplication circuit 400. The disadvantage of virtual earth sensing circuit 500 is its sensitivity to noise, which results from the bandwidth required of operational amplifier 514 to respond to quickly changing voltages at its summing node (inverting input 518). In addition, the operational amplifier 514 requires a dual power supply in order to provide the required bandwidth.

Accordingly, it would be desireable to provide methods and apparatus for sensing currents which methods and apparatus provide improved noise immunity, low power dissipation and accuracy with a single supply operational amplifier.

SUMMARY OF THE INVENTION

It is an object of the invention to provide a method and apparatus for accurately sensing currents.

It is a further object of the invention to provide a method and apparatus for efficiently sensing switched currents.

It is an additional object of the invention to provide a method and apparatus for accurately sensing, rapidly changing switched currents.

It is a feature of the invention to use power-carrying, sensing and reference generating DMOS devices to sense switched currents.

It is an additional feature of the invention to use a single supply comparator to sense switched currents.

It is a further feature of the invention to use a pair of matched sense devices to sense switched currents.

It is yet another feature of the invention to prevent switched current transients from passing through a sense device.

It is an advantage of the invention to reduce power dissipation resulting from sensing of switching currents.

It is an additional advantage of the invention to reduce dependence of the accuracy of sensing upon device material property variations and temperature.

It is a further advantage of the invention to simplify assembly of current sensing circuits.

It is yet another advantage of the invention to accurately sense switching currents without the need for a dual-supply comparator or a dual supply power supply.

According to one aspect of the invention, in order to sense current flowing through a switching device, the invention utilizes a string of matched series-connected devices coupled across the switching device to generate a sense potential representative of the amount of current flowing through the switching device, the sense potential being equal to a known proportion of the voltage drop across the switching device. In addition, at least one of the series-connected devices is switched on either with or after the switching of the switching device, in order to prevent spurious signals from contaminating the sense potential.

According to another aspect of the invention, a reference potential for comparison with the sense potential is generated by forcing a known current through a reference device that (1) has material properties matched to those of the switching device, and (2) receives a turn-on excitation which is constant and equal in magnitude to the amplitude of a turn-on pulse applied to the switching device. With such an arrangement, the potential across the switching device is equal to the potential across the reference device, and the respective currents flowing through the switching device and the reference device are in the same proportion as the physical sizes of the devices.

According to a further aspect of the invention, a circuit for sensing current flowing through a switching device having resistive voltage-current characteristics includes a first and second power terminal for the application therebetween of an operating potential, an impedance connected between the first power terminal and a node, a switching device having resistive voltage-current characteristics, the switching device having its main conduction path connected between the node and the second power terminal for controlling the flow of current through the impedance and at least two sense devices coupled between the node and the second power terminal, operative to divide the potential at the node to thereby provide a sensed potential, at least one of the sense devices being switched into a conductive state either synchronously with or after the switching of the switching device.

According to an additional aspect of the invention, a method of sensing current flowing through a switching device having resistive voltage-current characteristics includes the steps of sampling the potential at a node connecting an impedance with the switching device, the switching device repetitively interrupting the flow of current through the impedance, generating a sensed potential by dividing the sampled potential only when the switching device is turned on and generating a reference potential for comparison with the sensed potential.

According to a further aspect of the invention, in order to sense the amount of current flowing through a switching device, a point from which the sense potential is obtained is alternately coupled to the switching device through a switched sense device and to ground through a constantly-on sense device.

According to yet another aspect of the invention, in order to sense the amount of current flowing through a switching device a potential proportional to the voltage drop across a switching device is taken from a node or tap point along a string of matched, series-connected sense devices connected between a load terminal and ground or common. In order to generate a cleaner sense potential, at least one of the sense devices operates as a pass gate to block spurious signals from contaminating the sense potential, such sense devices being turned on either with or after the turn on of the switching device. This prevents transients arising from the alternate conduction and non-conduction of the switching device from contaminating the sense potential. In addition, the remaining sense devices connected between the tap point and ground are continuously on, to thereby provide a d.c. impedance to anchor the tap point to ground.

According to yet a further aspect of the invention, the amplitude of the potential which turns on the switching device and the switched sense device is equal to the amplitude of the potential which turns on the continuously on sense devices.

An additional aspect of the invention utilizes a single sense device which is switched into conduction either simultaneously with or after the switching into conduction of a switching device, the sense device coupled to a comparator for comparison with a reference potential.

These and other objects, features and advantages will become apparent when considered with reference to the following description and the accompanying drawings.

DETAILED DESCRIPTION OF THE PREFERRED EMBODIMENTS

Figure 6:
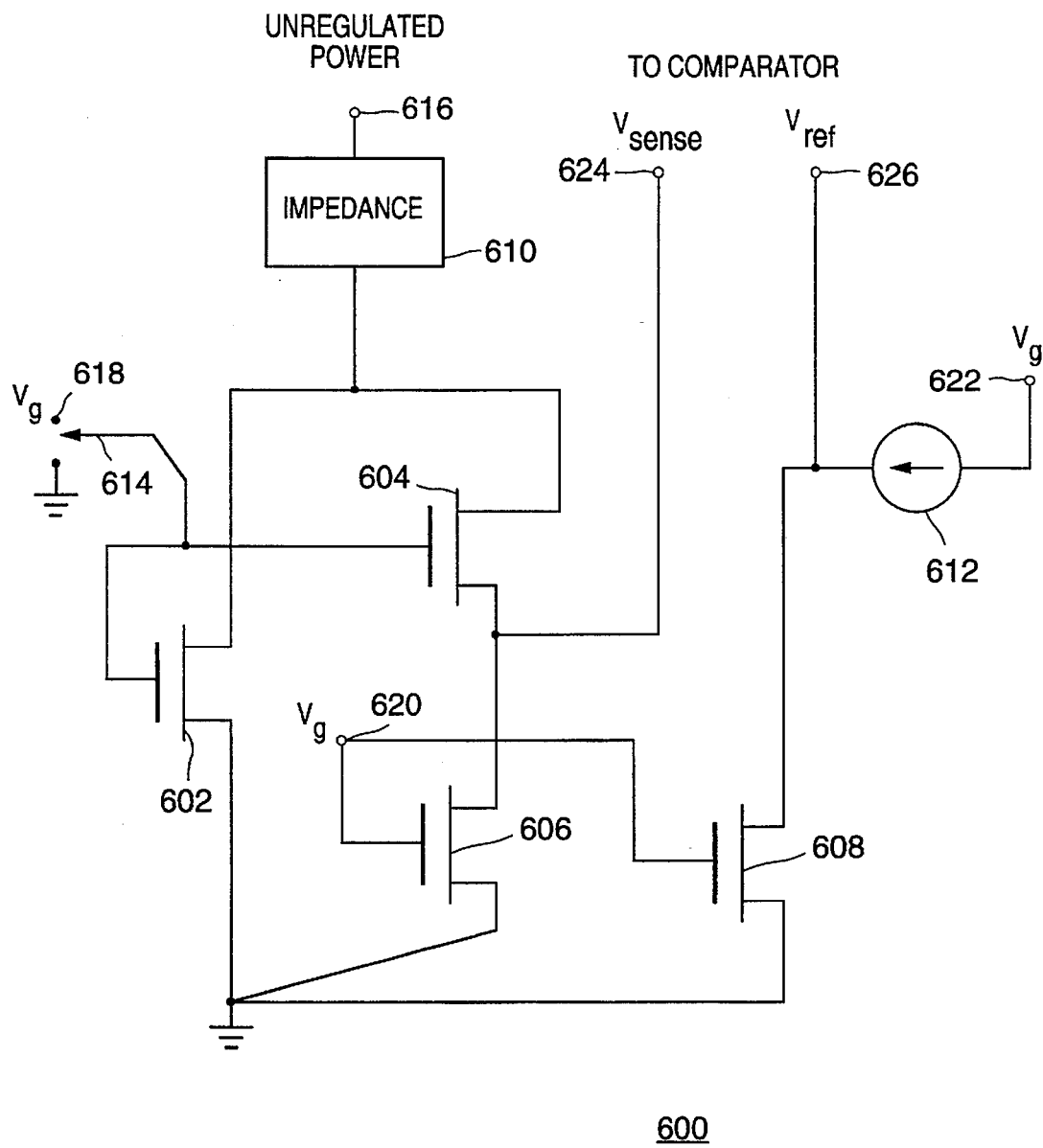
FIG. 6 is a simplified schematic diagram of a circuit for ratioed reference sensing of switched current in accordance with the present invention.

With reference now to FIG. 6 a circuit 600 for sensing switching mode power supply switch current in accordance with the invention is shown. Circuit 600 includes a switching device 602, a first sense device 604, a second sense device 606, a reference device 608, an impedance 610, a current source 612 and a switch 614. A suitable circuit which can be used as current source 612 is manufactured and sold by National Semiconductor Corporation of Santa Clara, Calif. under the designation LM134. The LM134 is a precision 3-terminal current source. As illustrated in FIG. 6, devices 602, 606, 606 and 608 are insulated gate field effect transistors. However, as will be appreciated by those skilled in the art, other switching or control devices which exhibit resistive voltage-current characteristics when functioning as switches, may be used in place thereof.

An unregulated power input 616 is coupled to impedance 610. A gate drive voltage, $V_g$, is provided to voltage inputs 618, 620 and 622 while a sense voltage, $V_{sense}$, and a reference voltage, $V_{ref}$ are each coupled to a comparator (not shown) from junctions 624 and 626, respectively.

In further detail, the junction of the gates of switching device 602 and first sense device 604 are connected to switch 614. Power from unregulated power input 616 flows through impedance 610. Most of the current flowing from impedance 610 flows through switching device 602 instead of through sense devices 604 and 606. In a preferred embodiment of the invention, the ratio of current through switching device 602 to current through sense devices 604 and 606 is over 1000.

Switching device 602 has a width-to-length ratio designated as $(W/L)_{pwr}$. Sense device 604 has a width-to-length ratio designated as $(W/L)_{sense1}$, while sense device 606 has a width-to-length ratio designated as $(W/L)_{sense2}$. Reference device 608 has a width-to-length ratio designated as $(W/L)_{ref}$. In accordance with a preferred embodiment of the invention, the dimensions of reference device 608 is a selected fraction of the dimensions of switching device 602, thus providing a known ratio. Furthermore, in accordance with a preferred embodiment of the invention, the material properties of reference device 608, that is the electrical and thermal characteristics of the material from which reference device 608 is fabricated, are matched to those of switching device 602. In addition, in accordance with a preferred embodiment of the invention, the dimensions of sense devices 604 and 606 are matched, but need not have the same width-to-length ratio. In a preferred embodiment of the invention the aspect ratio of sense devices 604 and 606 are equal, but they need not be equal. Furthermore, it is not necessary to establish a particular match or ratio between the switching device 602 and either of sense devices 604 and 606. Similarly, it is not necessary to establish a particular match or ratio between the reference device 608 and either of sense devices 604 and 606.

In operation, circuit 600 works by compares a known fraction, designated as $K_{sense}$, of the drain voltage of switching device 602, designated as $V_{d,Pwr}$, to the drain voltage of reference device 608, designated as $V_{d,Ref}$ which carries a known current $I_{ref}$ from current source 612. If the voltages at the gates of switching device 602 and reference device 608 are equal, and the size ratio of the switching device 602 and reference device 608 is, for example, $K_{A,Pwr}$, then if the sense voltage, $V_{sense}$, equals the reference voltage, $V_{ref}$, the drain current of the switching device 602, $I_{D,Pwr}$, can be calculated as:

$$I_{D,Pwr} = I_{ref} \times K_{A,Pwr}/K_{sense},$$

where $$K_{sense} = R_{on,sense1}/(R_{on,sense1} + R_{on,sense2}) \text{ and}$$

$R_{on}$=resistance of device when device is switched on.

In a preferred embodiment of the invention, the gate-source voltage applied to sense devices 604 and 606 is large in relation to the threshold of each device (i.e., 7 to 10 volts above the threshold potential). Therefore, since except for the switching of the gate drive voltage, $V_g$, the potential applied to the gate of each of sense devices 604 and 606 is essentially the same, the ratio of the on resistances is nearly equal to the ratios of the aspect ratios of each device. Therefore, $$K_{sense} = (W/L)_{sense2}/((W/L)_{sense1} + (W/L)_{sense2}).$$

A further feature of the invention is that the drain voltage of switching device 602 is not sensed directly, but instead through a DMOS divider network consisting of sense devices 604 and 606. In further detail, sense devices 604 and 606 are connected essentially in series from the source of switching device to ground or common. By knowing the geometry of each of sense devices 604 and 605, the voltage division provided to the gate of reference device 608 can be calculated. For example, if sense devices 604 and 606 are matched, this results in $V_{sense} = \frac{1}{2}$ the drain voltage of switching device 602 at a tap point which is formed by the junction of the source of sense device 604 and the drain of sense device 606. This tap point is coupled to sense voltage output 624. In the preferred embodiment of the invention, the geometries, but not necessarily the physical size, of switching device 602 and reference device 608 match, thereby resulting in similar or nearly identical transconductance characteristics.

Yet another feature of the invention is that the sense device which is coupled to the drain of switching device 602, sense device 604, is simultaneously switched with switching device 602 so that the sense node (the junction of the source of sense device 604 and the drain of sense device 606) is decoupled from the switching device 602 when switching device 602 is switched off by switch 614. This in turn decouples $V_{sense}$ output 624. In operation, a driver circuit (not shown) drives a switch 614 (which may, for example, be a bipolar transistor) to thereby successively couple and decouple the gates of switching device 602 and sense device 604 to a gate drive voltage $V_g$. In a preferred embodiment of the invention such a driver circuit need only be capable of driving the capacitance inherent in the gates of switching device 602 and sense device 604 up to the gate drive voltage $V_g$ at a frequency and duty cycle sufficient to achieve the desired flow of current through impedance 610.

Since when switch 614 is coupled to ground, the sense node is not only decoupled from the drain of switching device 602, but is also pulled to ground by the constant impedance of sense device 606, this switching arrangement minimizes the level of noise capacitively coupled to voltage sense output 624. Such noise, for example, results from transients present at the drain of switching device 602 during switch-off-by switch 614.

In further detail, the gates of sense device 606 and reference device 608 are biased with an unswitched gate voltage $V_g$ to thereby cause both devices to conduct. Such unswitched forward biasing provides two advantages. First, it stabilizes both the sense voltage output 624 and the reference voltage output 626. The second advantage is that such a circuit is more frequency stable (i.e., the poles and zeros of the transfer function of the circuit are farther down the frequency axis).

Figure 7:
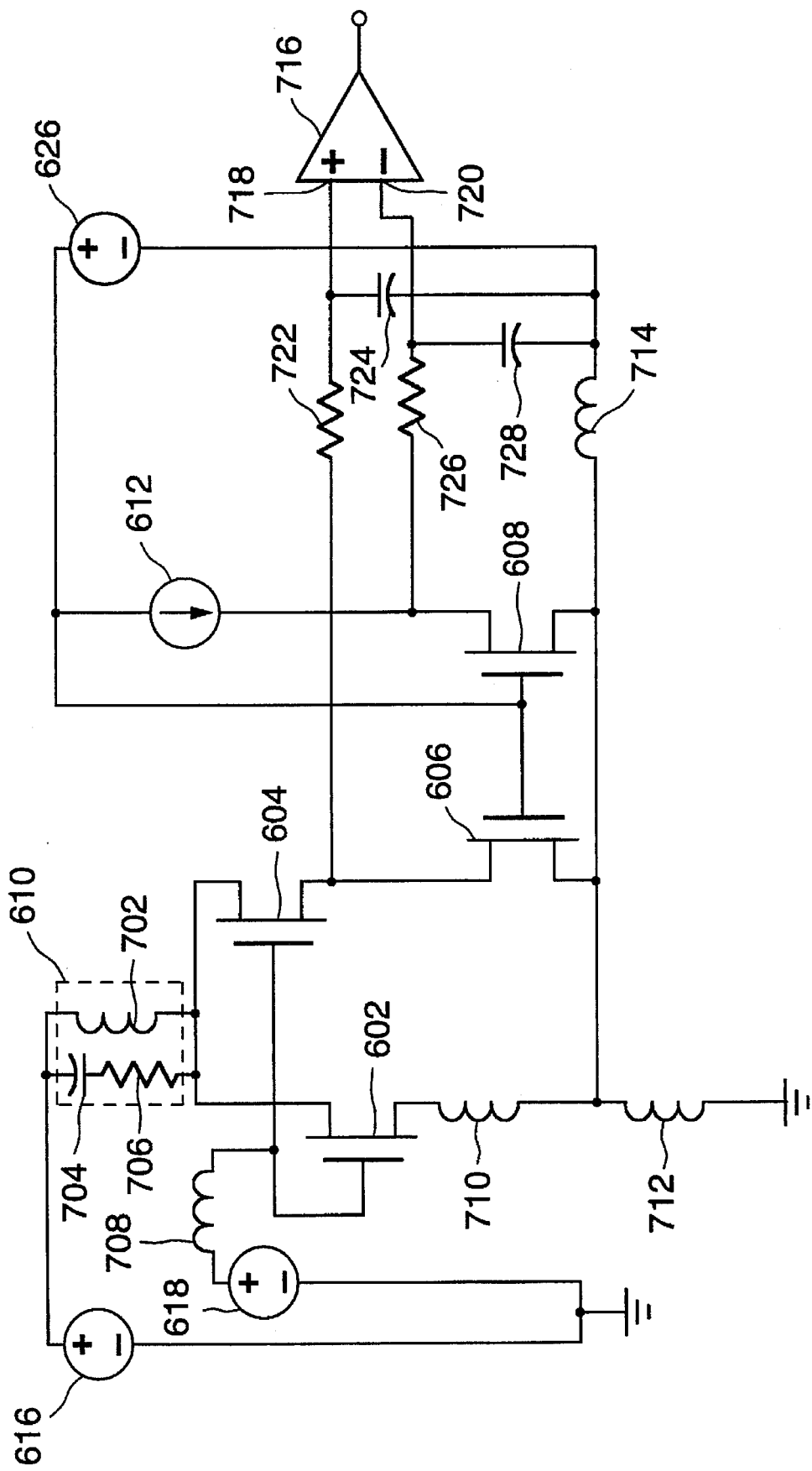
FIG. 7 is a detailed schematic diagram of a circuit for ratioed reference sensing of switched current in accordance with the present invention.

With reference now to FIG. 7, the preferred embodiment of the invention as described with reference to FIG. 6 is described in further detail, where like reference numerals refer to the same devices and components. Within current sense circuit 700, except for an inductance 702, all inductances as hereinafter described are parasitic capacitances resulting from circuit layout within a substrate. In further detail, inductance 702 together with a capacitance 704 and a resistance 706 are representative of impedance 610 of FIG. 6. Capacitor 704 and resistor 706 together function as a snubber circuit. Inductances 708, 710, 712 and 714 have a value in the sub-nanohenry range, as detailed further herein. A comparator 716, has its non-inverting input 718 coupled to the junction of the source of sense device 604 and the drain of sense device 606. This junction corresponds to $V_{sense}$ output 624 of FIG. 6. An inverting input 720 of comparator 716 is coupled to the drain of reference device 608. The potential at the drain of reference device 608 corresponds to $V_{ref}$ output 626 of FIG. 6. A resistor 722 together with a capacitor 724 operate as a low-pass filter to non-inverting input 718. Similarly, a resistor 726 and a capacitor 7280 operate as a low pass filter to the inverting input 720. Each such low-pass filter operates to further suppress transients which may be radiated or otherwise coupled from the impedance 610.

Figure 8:
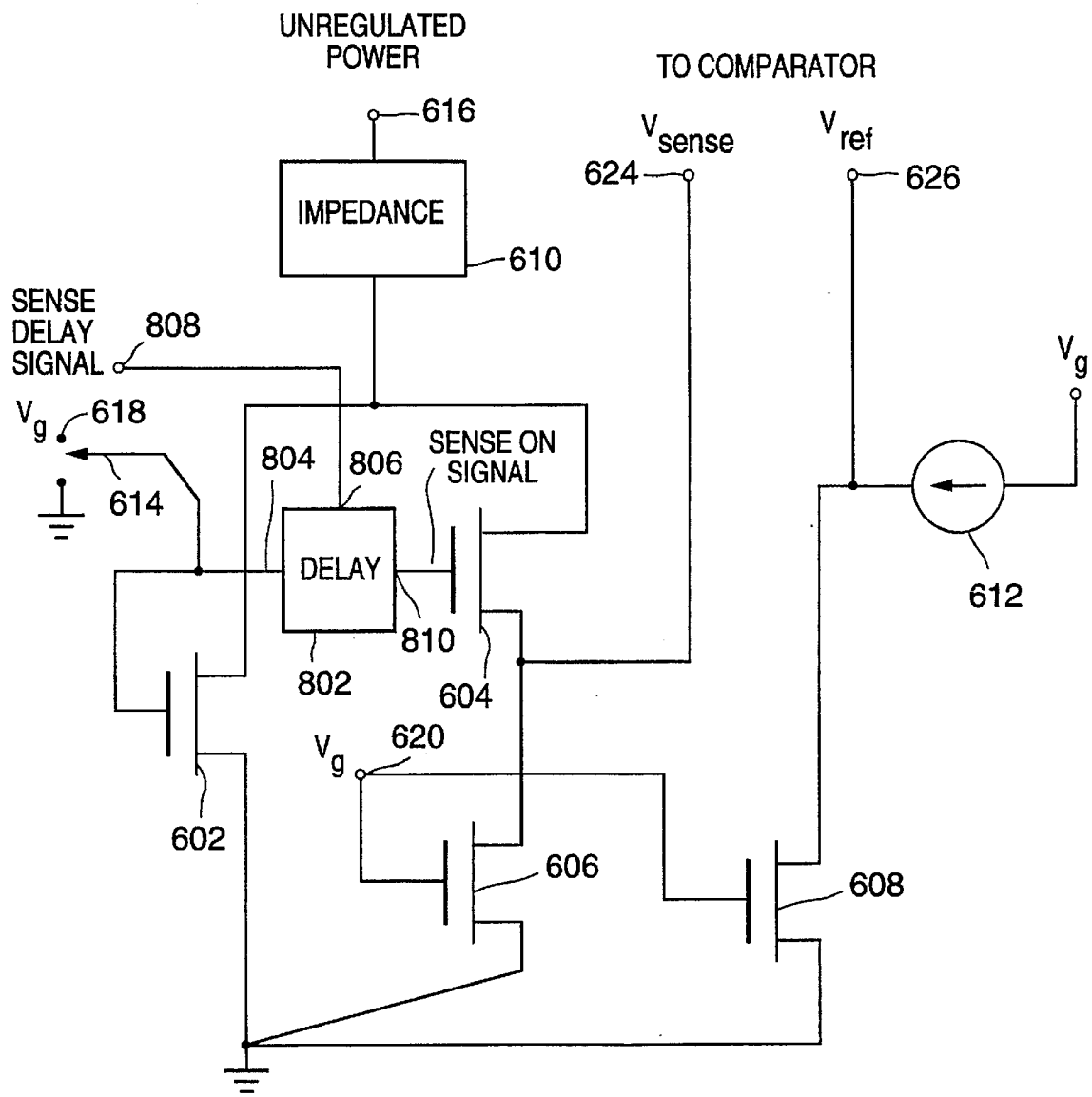
FIG. 8 is a simplified schematic diagram of an alternative embodiment of a circuit for ratioed reference sensing of switched current.
Figure 9:
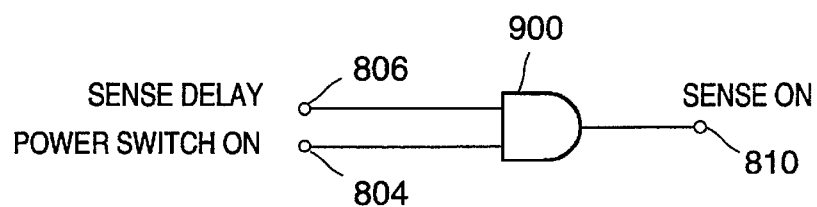
FIG. 9 is a block diagram of an AND gate embodiment of the delay circuit utilized in the embodiment of FIG. 8.

Referring to FIG. 8, an alternative embodiment of the invention illustrated in FIG. 6 is now explained, utilizing like reference numerals for like elements. A circuit 800 for sensing the amount of current flowing through a switching device utilizes a delay circuit 802 to delay the conduction of sense device 604. This delay in the conduction of sense device 604 helps prevent spurious signals from appearing at voltage sense output 624, since, for example, transients will have decayed before sense device 604 is switched on. In further detail, delay circuit 802 has a first input 804 coupled to switch 614 in common with the gate of switching device 602. Delay circuit 804 has a second input 806 coupled to a sense delay signal input 808. An output 810 of delay circuit 802 is coupled to the gate of sense device 604. A suitable circuit for use as delay circuit 802 is an AND gate 900 as illustrated in FIG. 9. The sense delay signal at input 808 is generated by passing the power switch on signal provided to the gate of switching device 602 through a capacitive delay circuit to thereby delay the rise of the power switch on signal by a preselected delay, $T_{delay}$.

Figure 10A:
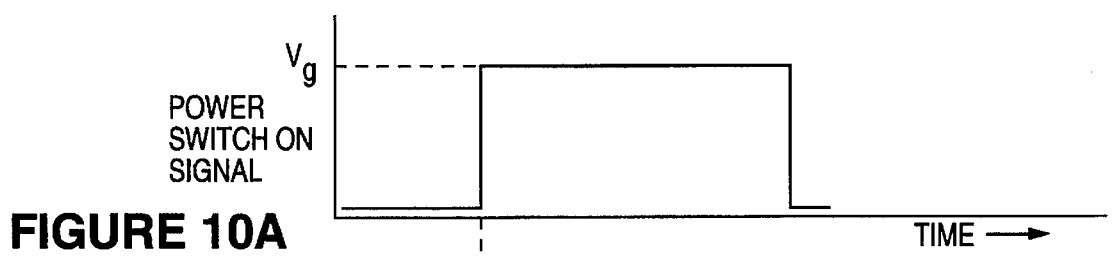
FIGS. 10A, 10B and 10C are timing diagrams illustrating a sense delay signal utilized in the embodiment illustrated in FIG. 8.
Figure 10B:
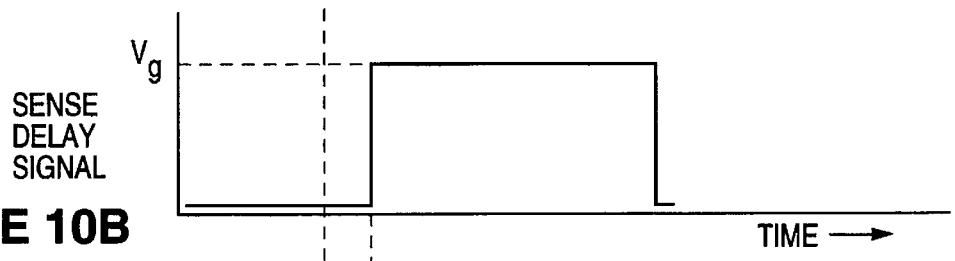
Figure 10C:
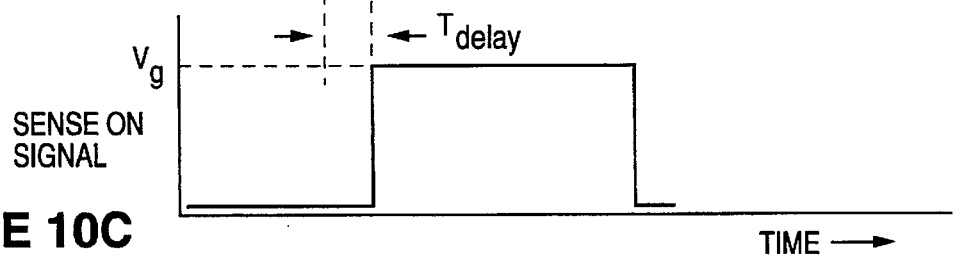

Referring also now to FIGS. 10A, 10B and 10C, when switch 614 is coupled to gate drive voltage input 618, also referred to as the power switch on signal, as soon as a sense delay signal rises to the same potential, delay circuit 802 provides a potential equal to that of the gate drive voltage, $V_g$, at its output 810 and thus to the gate of sense device 604. This delayed turn-on of sense device 604 allows time for transients and other spurious signals to delay, to thereby prevent contamination of the sense potential provided at sense potential output 624. In the preferred embodiment of the invention illustrated in FIG. 8, the length of delay, $T_{delay}$, between the power switch on signal and the sense delay signal is 100 nanoseconds. However, the amount of delay is selected to account for the frequency at which switching device 602 is switched, as well as the reactive components of impedance 610, and any other factors which affect transient decay as it may appear at the sense voltage output 624. In further detail, a potential proportional to the voltage drop across switching device 602 is taken from a tap point at the junction of sense devices 604 and 606. In order to generate a cleaner sense potential, sense devices 604 and 606 are excited in the following manner: (1) sense device 604 operates as a "pass gate" to block spurious signals from reaching the sense potential output 624, by turning on after an amount of time, $T_{delay}$, after turn on of switching device 602; (2) Sense device 606 is continuously on, thereby providing a d.c. impedance to "anchor" the tap point to ground; and (3) in the preferred embodiment of the invention, the amplitude of the of the power switch on signal is equal to the amplitude of the steady signal, $V_g$, which continuously turns on the sense device 606, which sense device anchors the tap point. It will be understood by those skilled in the art that more than two sense devices can be utilized in series and/or parallel arrangements, and that more than one sense device can operate as a "pass gate" or as an "anchor" as described above. Furthermore, in the case where $T_{delay}=0$, the circuit 800 operates in the same way as circuit 600 of FIG. 6.

Figures 4, 5:
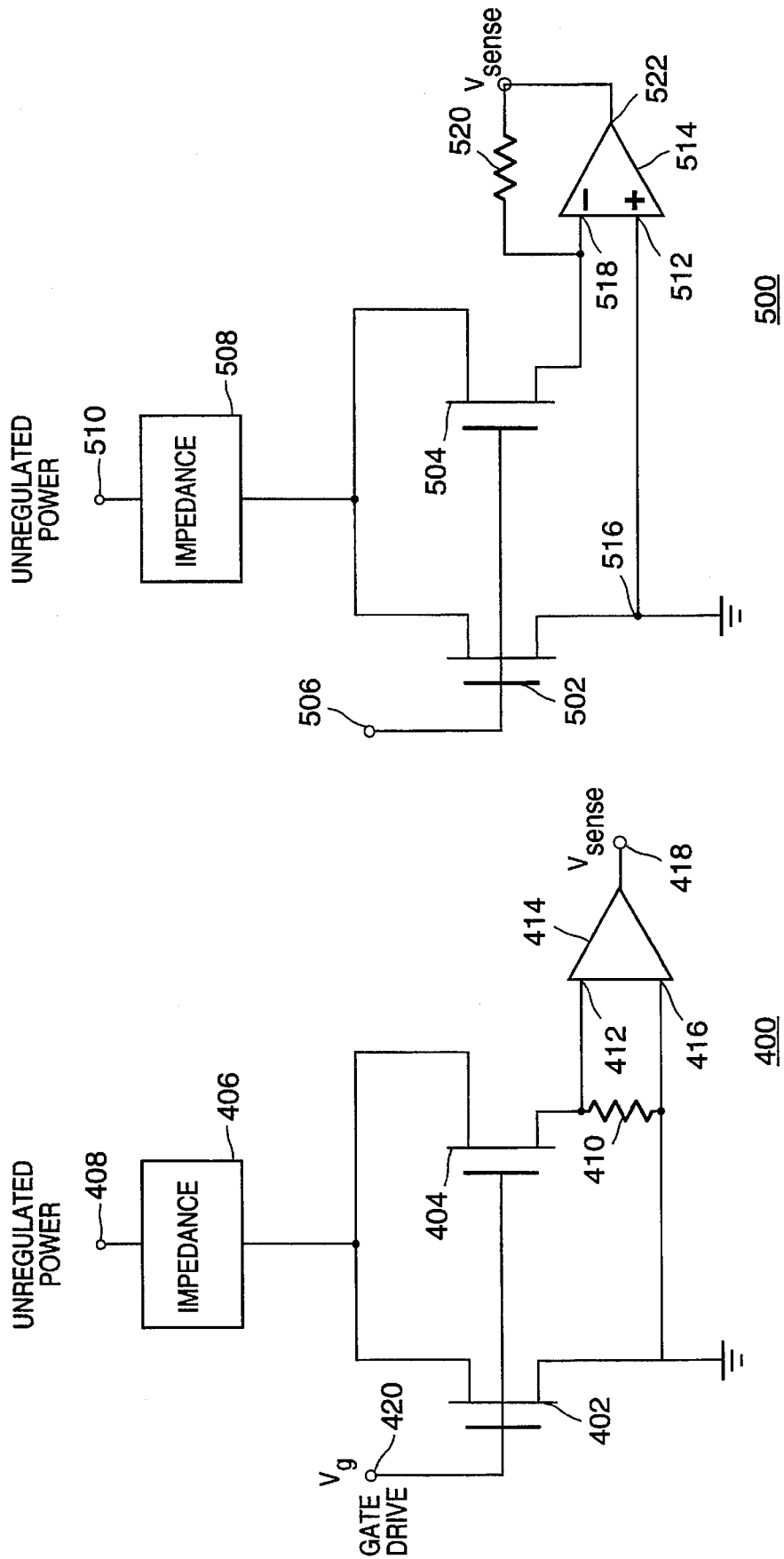
FIG. 4 is a schematic diagram of a circuit for resistive multiplication source sensing of switched current.
FIG. 5 is a schematic diagram of a circuit for virtual earth source sensing of switched current.
Figure 11:
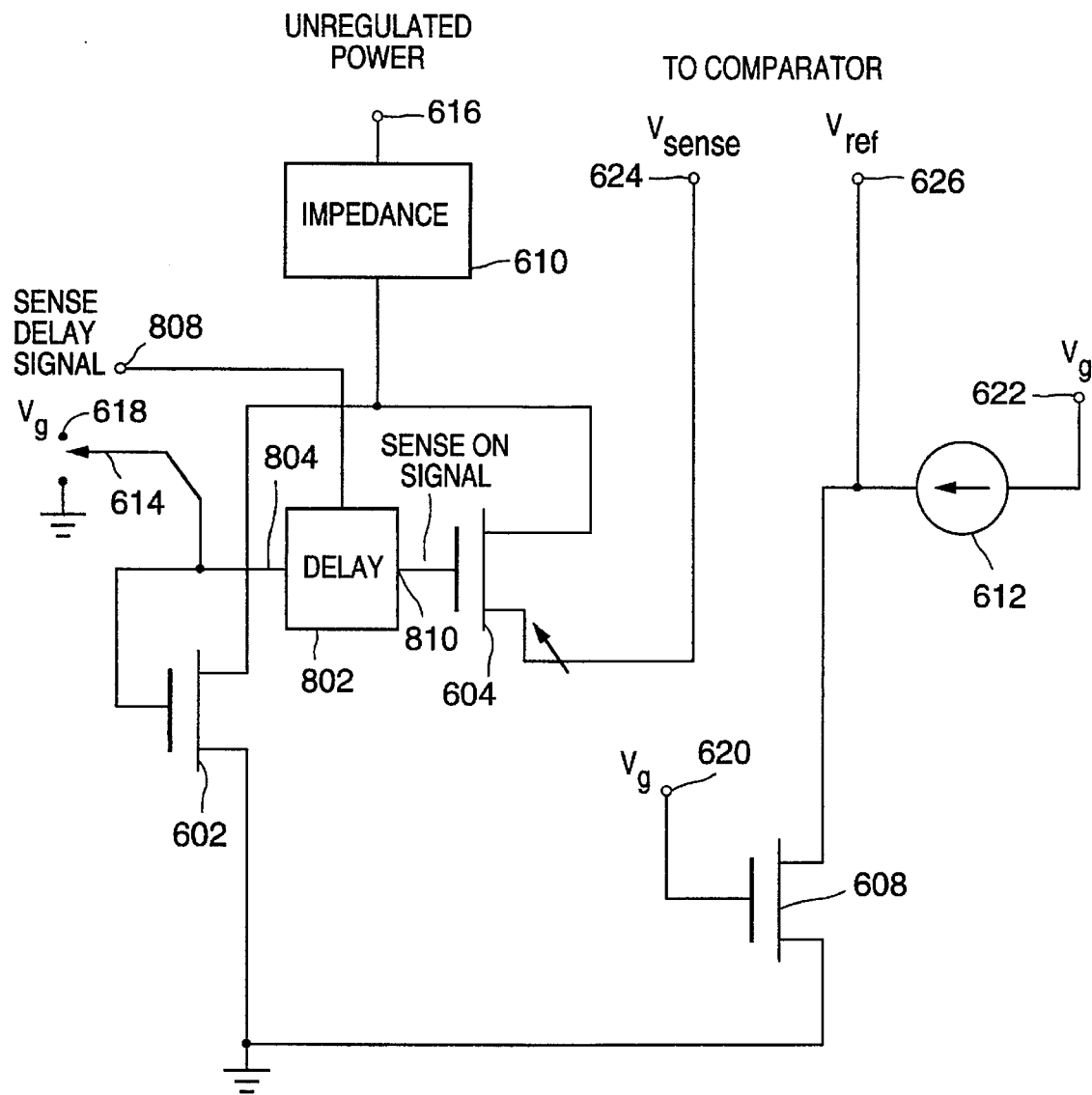
FIG. 11 is a simplified schematic diagram of yet another embodiment of a circuit for ratioed reference sensing of switched current.

Referring now to FIG. 11, an alternative embodiment of the invention illustrated in FIG. 8 is now explained, utilizing like reference numerals for like elements. In contrast to the circuit 800 of FIG. 8, a circuit 1100 of FIG. 8 does not include an anchor device such as sense device 606 of FIG. 8. In further detail, when sense device 604 is switched on by the sense on signal from delay circuit 802, where $T_{delay>}0$, the potential at the source of sense device 604 rises to the potential at the source of switching device 602, assuming a relatively high input impedance at the comparator coupled to the sense voltage output 624. The rise time for the voltage at the source of sense device 604 is dependent upon the drain-to-source capacitance of sense device 604. Similarly, the decay time for the voltage at the source of sense device 604 is dependent upon the drain-to-source capacitance of sense device 604. In contrast to the circuit 500 of FIG. 5, the comparator of circuit 800 compare the sense potential at output 624 to the reference potential at output 626. Circuit 500, in contrast, utilizes an operational amplifier 514 to convert current flowing through the source of sense device 504 to a sense voltage which appears at the output 522.

Figure 1:
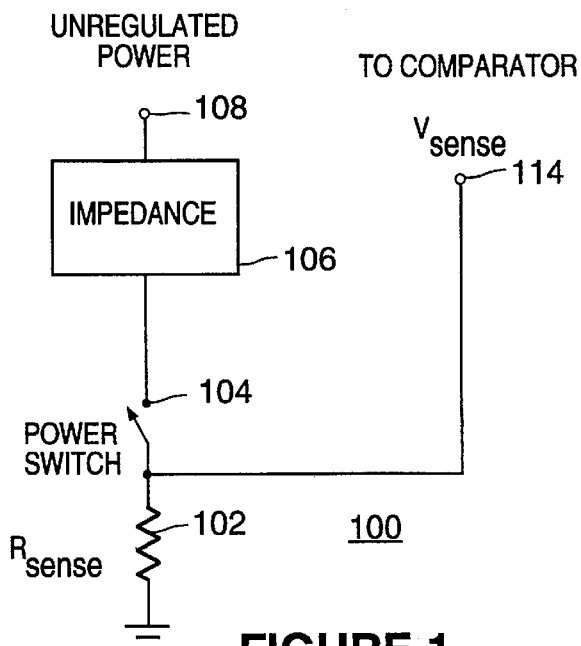
FIG. 1 is a simplified schematic diagram of a circuit for resistive sensing of switched current.
Figure 2:
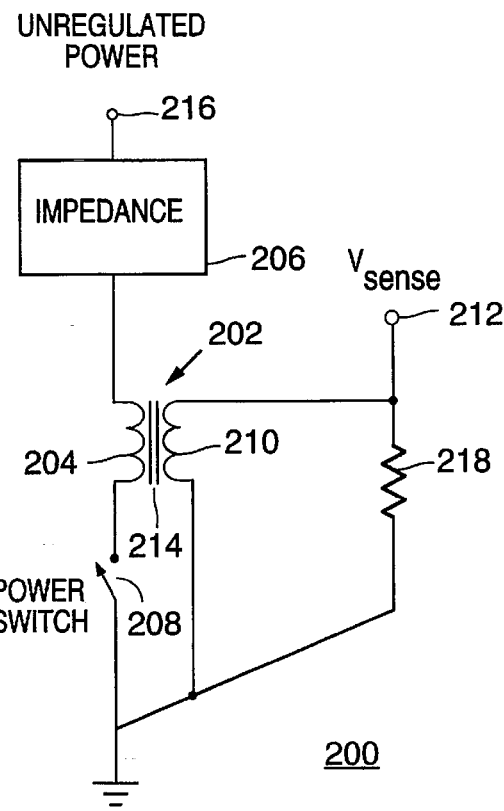
FIG. 2 is a simplified schematic diagram of a circuit for magnetic sensing of switched current.
Figure 3:
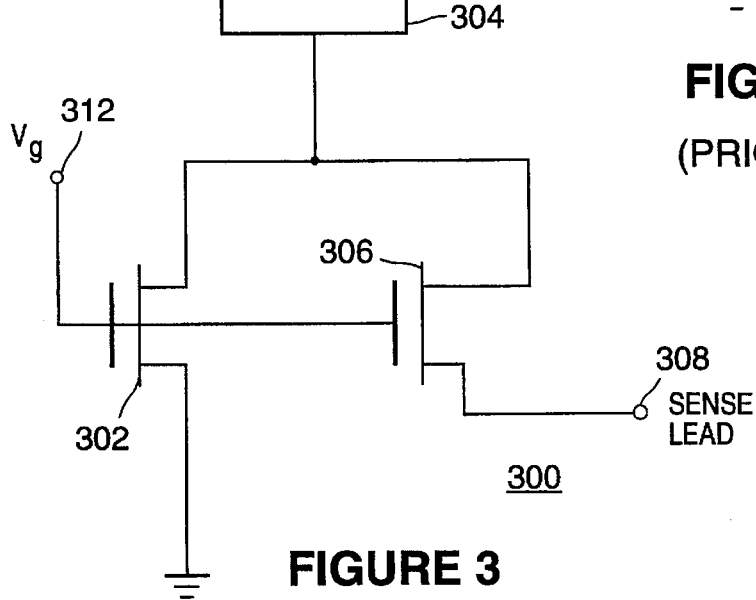
FIG. 3 is a schematic diagram of a circuit for source sensing of switched current.

Thus, in contrast to a resistive sensing circuit of FIG. 1, the sense impedance of the circuit of the present invention dissipates significantly less power. In addition, because the power, sense and reference devices, which in the preferred embodiment of the invention are DMOS devices, are fabricated in monolithic form, the accuracy of sensing of switched current exhibits only a weak dependence on factors such as material property variations and temperature. Furthermore, because the power, sense and reference devices are fabricated in the same material, there are no assembly problems such as those encountered with the magnetic sensing circuit of FIG. 2. Moreover, the present invention provides an accurate sensing of switched current without the need for a high-speed dual-supply operational amplifier as a comparator. In contrast, both the resistive multiplication circuit of FIG. 4 and the virtual earth circuit of FIG. 5 require a high speed operational amplifier (as a comparator) in order to provide useful sensing. The resistive multiplication circuit of FIG. 4 requires a high-speed operational amplifier in order to sufficiently amplify the sense voltage. The virtual earth circuit of FIG. 5 requires a high-speed operational amplifier in order to make the voltage on the source of the sense device 504 track the voltage on the source of the switching device 502.

Through the use of switched sensing and ratioed reference potential generation of the present invention, current sensing with improved noise immunity, improved accuracy and relative insensitivity of process and temperature variation is provided.

The following component (both parasitic and non-parasitic) values have been found satisfactory for an operative embodiment of the invention as shown in FIG. 7. The inductances other than inductance 702 are parasitic, resulting from wires and printed circuit board traces. The capacitances other than capacitance 704, 724 and 728 are parasitic:

| REFERENCE NUMERAL | TYPE | VALUE OR MODEL NUMBER |
|---|---|---|
| 702 | inductance | 50 microhenries |
| 704 | capacitance | 5 nanofarads |
| 706 | resistance | 100 ohms |
| 708 | inductance | 1 nanohenry |
| 710 | inductance | 0.2 nanohenries |
| 712 | inductance | 0.2 nanohenries |
| 714 | inductance | 10 nanohenries |
| 716 | comparator | National Semiconductor LM 306 |
| 722 | resistance | 1000 ohms |
| 724 | capacitance | 20 picofarads |
| 726 | resistance | 1000 ohms |
| 728 | capacitance | 20 picofarads |

Although only certain embodiments have been described in detail, those having ordinary skill in the art will certainly understand that many modifications are possible without departing from the teachings thereof. All such modifications are intended to be encompassed within the following claims.

We claim:

1. A method of sensing current flowing through a switching device having resistive voltage-current characteristics, comprising the steps of:

sampling a potential generated across the switching device, the switching device repetitively interrupting the flow of current through an impedance;

generating a sensed potential by coupling to an output at least a portion of the sampled potential only during at least a portion of a period when the switching device is turned on; and generating a reference potential for comparison with the sensed potential.

2. The method of claim 11, wherein generating a reference potential further comprises the steps of:

continuously biasing a reference device into a conductive state, the reference device having material properties which are matched to those of the switching device and dimensions which are a fraction of corresponding dimensions of the switching device; and routing a constant current through the reference device.

3. The method of claim 2, wherein the step of continuously biasing a reference device into a conductive state further comprises the step of:

continuously biasing the reference device into a conductive state at the same potential as a bias applied to the switching device to control the flow of current through the impedance.

* * * * *

UNITED STATES PATENT AND TRADEMARK OFFICE
CERTIFICATE OF CORRECTION

PATENT NO. : 5,646,520
DATED : July 8, 1997
INVENTOR(S) : RICHARD FRANK ET AL.

It is certified that error appears in the above-indentified patent and that said Letters Patent is hereby corrected as shown below:

In Col. 12, line 16, delete "11" and replace with --1--.

Signed and Sealed this

Second Day of September, 1997

Attest:

BRUCE LEHMAN

*Attesting Officer*    Commissioner of Patents and Trademarks